United States Patent [19]
Kim et al.

[11] Patent Number: 5,491,047
[45] Date of Patent: Feb. 13, 1996

[54] METHOD OF REMOVING A SILYLATED OR GERMANIUM IMPLANTED PHOTORESIST

[76] Inventors: Hyeong Soo Kim, Sungkwang Bidulgi Apt. 2-302, Shinha-Ri, Bubal-Uep, Ichon-Gun; Tai Kiyung Won, 657-70 Myungmok 7-dong, Chungrang-Gu, Seoul, both of Rep. of Korea, 131-207

[21] Appl. No.: 254,005

[22] Filed: Jun. 3, 1994

[30] Foreign Application Priority Data

Jun. 3, 1993 [KR] Rep. of Korea .................... 96-9938

[51] Int. Cl.$^6$ .................................................. G03F 7/42
[52] U.S. Cl. ...................... 430/329; 430/315; 430/324; 430/330
[58] Field of Search ................................. 430/311, 313, 430/314, 315, 322, 324, 325, 329, 330

[56] References Cited

U.S. PATENT DOCUMENTS

| | | |
|---|---|---|
| 4,599,118 | 7/1986 | Han et al. |
| 5,166,038 | 11/1992 | Clodgo .................................... 430/325 |
| 5,217,851 | 6/1993 | Kishimura .............................. 430/330 |
| 5,252,433 | 10/1993 | Fujioka .................................. 430/323 |

Primary Examiner—Kathleen Duda

[57] ABSTRACT

A photoresist layer containing implanted silicon or germanium group coated on a wafer can be entirely removed from the wafer using a dry developing process using oxygen plasma by first out-diffusing or extracting the implanted silicon or germanium. Specifically, the implanted silicon- or germanium is removed from the photoresist by heating the photoresist in the same pre-silylation bake chamber used during the patterning process. Thereafter, the entire photoresist can be removed from the wafer by a dry developing process using oxygen plasma without contaminating the plasma strip equipment.

6 Claims, 3 Drawing Sheets

METHOD OF REMOVING A SILYLATED OR GERMANIUM IMPLANTED PHOTORESIST

BACKGROUND OF THE INVENTION

1. Field of the Invention

This invention relates to a method of removing a silicon- or germanium-containing photoresist. The invention comprises out-diffusing a silicon group within the silicon containing photoresist by heat treatment using a pre-silylation bake chamber and removing the silicon containing photoresist by a dry developing process using oxygen plasma.

2. Description of the Prior Art

In the prior art, there are two kinds of method that removes such photoresist, the wet etching method using a solvent and the dry etching method using oxygen plasma. The wet etching method is used to selectively remove the photoresist formed irregularly on the silicon substrate, and the dry etching method is used to remove the photoresist exposed to light.

However, since the photoresist layer is cured at a high temperature through a silylation process, the photoresist is not dissoluble in the solvent, and therefore the photoresist cannot be removed by the wet etching method. As for the dry etching method using oxygen plasma, the silicon group within the photoresist layer, reacting to the oxygen, forms a silicon oxide film(SiOx) on the surface of the photoresist, and the film contaminates the plasma strip equipment involved.

Therefore, a third method is desired to remove the photoresist containing a silicon group or a germanium group without such problems as mentioned above.

Therefore, it is an object of the present invention to solve the problems set forth in the prior art.

It is a further object of the present invention to provide a method of removing a photoresist containing a silicon group or a germanium group. The present invention comprises out-diffusing a silicon group with the silicon-containing photoresist by a heat treatment using a pre-silylation bake chamber and removing the photoresist by a dry developing process.

SUMMARY OF THE INVENTION

The method of removing the silicon-containing photoresist coated on a wafer is defined by the claims and a specific embodiment shown in the attached drawings.

For the summarizing the invention, the method comprises heat treating a silicon-containing photoresist using a pre-silylation bake chamber to out-diffuse the silicon within the silicon-containing photoresist, while the pre-silylation bake chamber maintains the temperature of the chamber at 20 to 180 degree Celsius and the pressure in the chamber at below 100 Torr.

BRIEF DESCRIPTION OF THE DRAWINGS

For a full understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
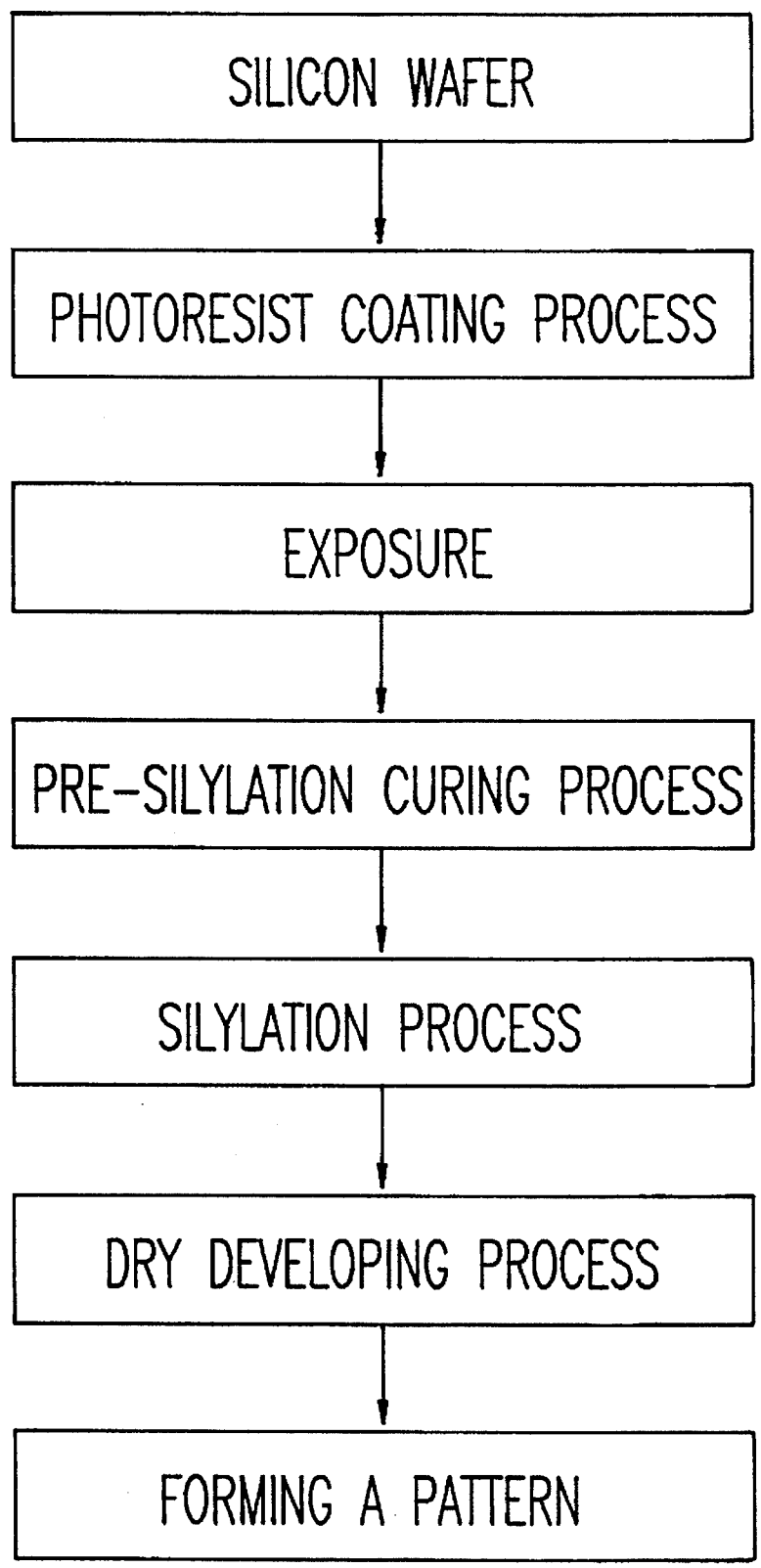
FIG. 1 is a flow chart showing the steps for forming a micro pattern on a silicon wafer using a silylation process.
Figure 2:
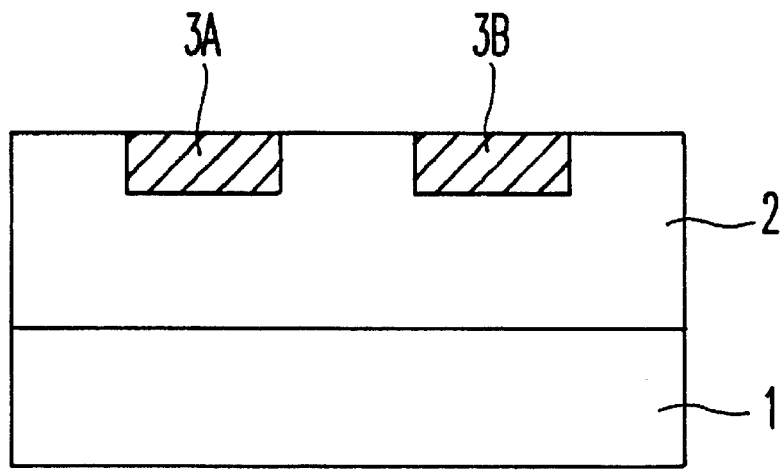
FIG. 2 and FIG. 3 are sectional views showing the steps for forming a micro pattern on a silicon wafer.
Figure 3:
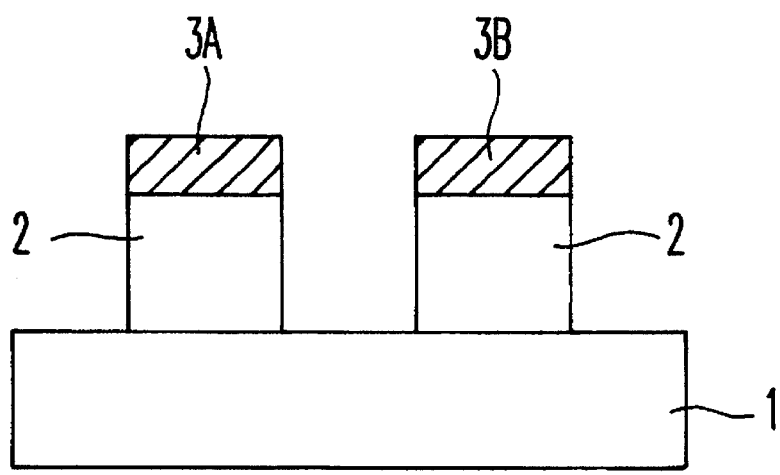

FIG. 1 is a flow chart showing the steps for forming a micro pattern on a silicon wafer using a silylation process, FIG. 2 and FIG. 3 are sectional views showing the steps for forming a micro pattern on a silicon wafer.

A photoresist 2 is coated on a silicon wafer 1 and a portion or portions of the photoresist 2 are exposed to light. The heat treatment is performed in a chamber with a high temperature and low pressure by means of a pre-silylation cure process for cross-linking the silicon wafer 1 and the photoresist 2. And then, by injecting an organic solvent such as TMD-S(Tetra Methyl Di-Silazane) or HMDS(Hexa Methyl Di-Silazane), a silicon group is implanted in the exposed region of the photoresist 2, silylation regions 3A and 3B are formed as shown in FIG. 2.

After the silylation process is completed, a pattern is formed by a development process with a dry developing equipment using a oxygen plasma. At this time, the etch selective ratio varies depending on the density of the silicon group within the photoresist, and those parts of the photoresist of less density are etched well to form the pattern as shown in FIG. 3.

In the course of manufacturing a semiconductor device, the silylation process is carried out on a plurality of silicon wafers, for example twenty five wafers as a unit, while the pattern forming process is taken on a selected wafer of them in addition to the silylation process. If the size of the pattern of the selected wafer is identical with the standard size of the pattern, the pattern forming process will be taken on the other wafers as well. Provided, the size of the pattern on the selected wafer is different from the standard size of the pattern, the photoresist formed on the wafer will be removed, and the whole manufacturing process will be carried out all over again form the beginning.

The present invention, therefore, relates to the method for removing the photoresist coated and silylated on a wafer. The photoresist contains a silicon group due to the silylation process.

The silicon wafer 1 on which a silicon-containing photoresist is coated is re-heated in the pre-silylation bake chamber(not shown) to out-diffuse the silicon group as the pre-silylation bake chamber maintains a low pressure (below 100 Torr) and a high temperature (above 150 degree Celsius).

Figure 5:
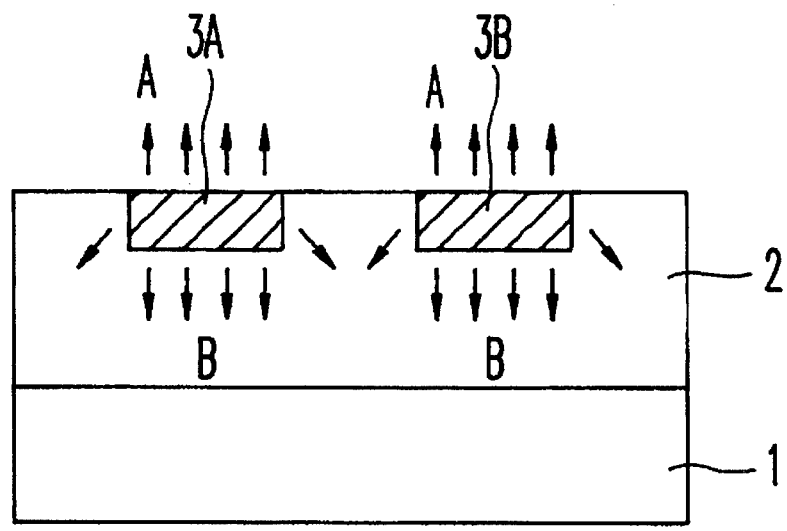
FIG. 5 is a sectional view showing diffusion paths of a silicon group within the silicon-containing photoresist.

During the reheating of the silicon wafer in the pre-silylation bake chamber, the silicon group is out-diffused by the heat. The diffusion paths are path A and path B as shown in FIG. 5. Path B is a penetration path to the cross linked region in the silicon-containing photoresist, while path A is a diffusion path toward outside of the silicon-containing photoresist.

Since the density of the silicon group outside the silicon-containing photoresist is close to zero and the pressure in the bake chamber carrying out the re-heat treatment is very low, the difference of density between the silicon group of the silicon-containing photoresist and the silicon group in the pre-silylation bake chamber increases, and the silicon group of the silicon-containing photoresist is out-diffused rapidly.

Therefore, the out-diffusion of the silicon group passing through path A toward outside the silicon-containing photoresist is easier than the penetration of silicon group passing through path B toward the cross-linked region.

Finally, the silicon-containing photoresist is removed completely by the dry developing process using oxygen plasma. The dry developing process is carried out with a RIE(Reactive Ion Etching) equipment using a magnetron for the removal of multi layer resists.

Figure 4:
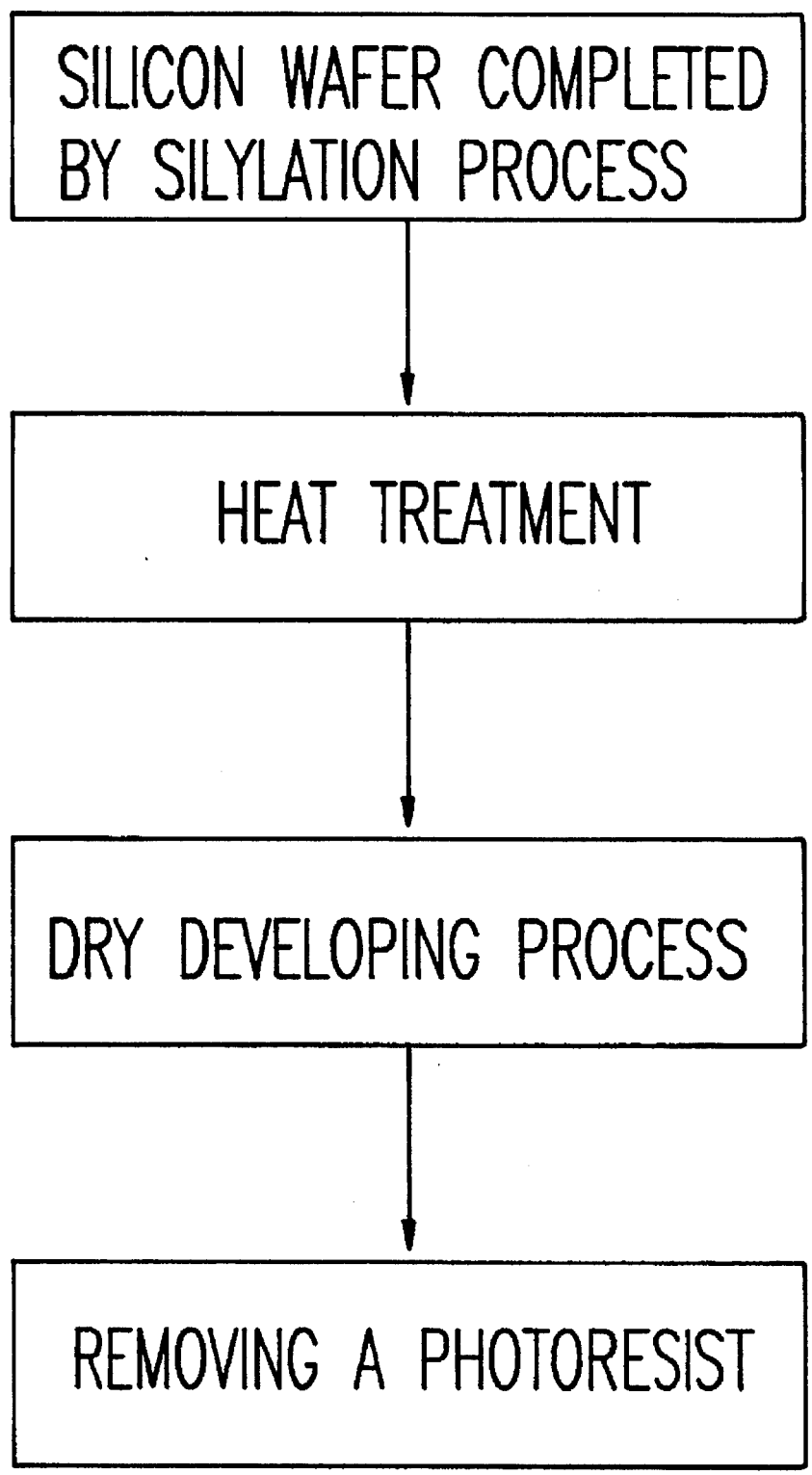
FIG. 4 is a flow chart showing the steps for removing a silicon-containing photoresist according to the process of the present invention.

FIG. 4 is a flow chart showing steps for removing a silicon-containing photoresist. In this process, the temperature and pressure in the re-heat treatment is not important, while it is desirable to maintain the temperature in the pre-silylation bake chamber of 20 to 180 degree Celsius and its pressure at below 100 Torr to expedite the removal the photoresist.

The germanium-containing photoresist can also be removed by the method described above.

The present invention has advantages in that a silicon group or a germanium group can be out-diffused by heating using the pre-silylation bake chamber without requiring any more equipment and the silicon-containing photoresist can be taken away by the dry developing method, without contaminating the pre-silylation bake chamber.

Although this invention has been described in its preferred form with a certain degree of particularity, it is appreciated by those skilled in the art that the present disclosure of the preferred form has been made only as an example and that numerous changes in the details of the construction, combination and arrangement of is parts may be resorted to without departing from the spirit and scope of the invention.

What is claimed is:

1. A method of removing a silylated photoresist comprising the steps of:

heat treating said photoresist using a pre-silylation bake chamber to out-diffuse the silicon contained within said silylated photoresist; and removing said photoresist in its entirety by a dry developing process using oxygen plasma.

2. The method of claim 1 wherein the pre-silylation bake chamber maintains conditions that the temperature of the chamber is at 20 to 180 degree Celsius and the pressure of the chamber is below 100 Torr.

3. The method of claim 1 wherein the dry developing process is carried out with a RIE equipment using a magnetron.

4. A method of removing a germanium implanted photoresist comprising the steps of:

heat treating said photoresist using a pre-silylation bake chamber to out-diffuse the germanium contained within said germanium implanted photoresist; and removing said photoresist in its entirety by a dry developing process using oxygen plasma.

5. The method of claim 4 wherein the pre-silylation bake chamber maintains conditions that the temperature of the chamber is at 20 to 180 degree Celsius and the pressure of the chamber is below 100 Torr.

6. The method of claim 4 wherein the dry developing process is carried out with a RIE equipment using a magnetron.

* * * * *